US011882707B2

(12) United States Patent
Boivin (10) Patent No.: US 11,882,707 B2
(45) Date of Patent: Jan. 23, 2024

(54) INTEGRATED CIRCUIT INCLUDING TRANSISTORS HAVING A COMMON BASE

(71) Applicant: STMicroelectronics (Rousset) SAS, Rousset (FR)

(72) Inventor: Philippe Boivin, Venelles (FR)

(73) Assignee: STMicroelectro (Rousset) SAS, Rousset (FR)

( * ) Notice: Subject to any disclaimer, the term of this patent is extended or adjusted under 35 U.S.C. 154(b) by 75 days.

(21) Appl. No.: 17/559,821

(22) Filed: Dec. 22, 2021

(65) Prior Publication Data

US 2022/0115441 A1    Apr. 14, 2022

Related U.S. Application Data

(62) Division of application No. 16/375,557, filed on Apr. 4, 2019, now Pat. No. 11,211,428.

(30) Foreign Application Priority Data

Apr. 6, 2018 (FR) ........................................ 1853041

(51) Int. Cl.
| | |
|---|---|
| *H10B 63/00* | (2023.01) |
| *H01L 21/8222* | (2006.01) |
| *H01L 27/082* | (2006.01) |
| *H01L 29/10* | (2006.01) |
| *H10N 70/20* | (2023.01) |
| *H10N 70/00* | (2023.01) |

(52) U.S. Cl.
CPC ......... *H10B 63/32* (2023.02); *H01L 21/8222* (2013.01); *H01L 27/0823* (2013.01); *H01L 29/1004* (2013.01); *H10B 63/80* (2023.02); *H10N 70/231* (2023.02); *H10N 70/826* (2023.02)

(58) Field of Classification Search
None
See application file for complete search history.

(56) References Cited

U.S. PATENT DOCUMENTS

| 6,211,029 B1 | 4/2001 | Kinoshita |
| 7,847,374 B1 | 12/2010 | Wang |
| 2006/0049392 A1 | 3/2006 | Pellizzer et al. |
| | (Continued) | |

FOREIGN PATENT DOCUMENTS

JP         2005-26392 A        1/2005

*Primary Examiner* — Joseph C. Nicely
*Assistant Examiner* — Lamont B Koo
(74) *Attorney, Agent, or Firm* — Seed IP Law Group LLP (57) ABSTRACT

The disclosure relates to integrated circuits including one or more rows of transistors and methods of forming rows of transistors. In an embodiment, an integrated circuit includes a row of bipolar transistors including a first semiconductor layer having a plurality of first conduction regions, a second semiconductor layer having a second conduction region, a common base between the first semiconductor layer and the second semiconductor layer, and a plurality of insulator walls extending in a first direction. The first conduction regions are separated from one another by the insulator walls. The integrated circuit further includes an insulating trench extending in a second direction and in contact with each of the bipolar transistors of the row of bipolar transistors. A conductive layer is coupled to the base, and the conductive layer extends through the insulator walls and extends at least partially into the insulating trench.

20 Claims, 3 Drawing Sheets

(56) References Cited

U.S. PATENT DOCUMENTS

2012/0099363 A1    4/2012   Inaba
2014/0252473 A1    9/2014   Loechelt et al.
2019/0312088 A1   10/2019   Boivin et al.

INTEGRATED CIRCUIT INCLUDING TRANSISTORS HAVING A COMMON BASE

BACKGROUND

Technical Field

The present disclosure concerns integrated circuits and more particularly the connections of bipolar transistors. The present disclosure more particularly applies to the forming of an array of memory cells.

Description of the Related Art

Memories are generally in the form of arrays, comprising word lines, and columns, or bit lines. A memory cell containing binary information is located at each crossing of a word line and of a bit line.

In a phase-change memory, each memory cell comprises a layer of a phase-change material having its lower portion in contact with a resistive element. Phase-change materials are materials which may switch from a crystalline phase to an amorphous phase, and conversely. Such a switching is caused by an increase in the temperature of the resistive element through which an electric current is conducted. The electric resistance difference between the amorphous phase of the material and the crystalline phase thereof is used to define two memory states, for example, 0 and 1.

In the example of a phase-change memory, the memory cells are for example controlled by bipolar transistors which conduct or not the current used to heat the resistive elements. The memory cells belonging to a same bit line are connected by a conductor covering the phase-change material and the memory cells belonging to a same word line are connected together by the bases of the bipolar transistors, for example, by a base common to all the transistors of a same word line.

The binary information of a memory cell of a phase change memory is for example accessed by measuring the resistance between the bit line and the word line of the memory cell.

BRIEF SUMMARY

In an embodiment, the present disclosure provides an integrated circuit including a row of bipolar transistors. The row of bipolar transistors includes a plurality of first conduction regions, a second conduction region, a common base between the first conduction regions and the second conduction region, and a plurality of insulator walls extending in a first direction. The first conduction regions are separated from one another by the insulator walls. An insulating trench extends in a second direction and is in contact with each bipolar transistor of the row of bipolar transistors. A conductive layer is coupled to the base and the conductive layer extends through the insulator walls and at least partially into the insulating trench.

According to an embodiment, the conductive layer includes a main conductive bar extending at least partially into the insulating trench and plurality of auxiliary conductive bars extending through the insulator walls and connected to the main conductive bar.

According to an embodiment, the conductive bars have a width in a range from 25 nm to 45 nm, inclusive.

According to an embodiment, each bipolar transistor controls a memory cell.

According to an embodiment, the memory cells are memory cells of a phase-change memory.

According to an embodiment, the conductive layer is connected by a single via to an interconnection network.

According to an embodiment, the conductive layer is made of metal.

According to an embodiment, the plurality of first conductive regions directly contacts the base, and the base directly contacts the second conduction region.

According to an embodiment, the each of the bipolar transistors of the row of bipolar transistors includes the second conduction region.

In another embodiment, the present disclosure provides a method that includes: forming a row of bipolar transistors having a common base, the common base being located between a plurality of first conduction regions and a second conduction region, the first conduction regions separated from one another by insulator walls, an insulating trench in contact with the row of bipolar transistors; forming a mask on the plurality of first conduction regions, the mask having a comb-shaped opening over the insulating trench and the insulator walls; forming cavities by etching through the opening and exposing portions of the common base between adjacent first conduction regions; and filling the cavities with a conductive material.

According to an embodiment, the exposed portions of the common base are more heavily doped than adjacent regions of the base.

According to an embodiment, the conductive material is a metal.

The foregoing and other features and advantages will be discussed in detail in the following non-limiting description of specific embodiments in connection with the accompanying drawings.

DETAILED DESCRIPTION

The same elements have been designated with the same reference numerals in the various drawings and, further, the various drawings are not to scale. For clarity, only those steps and elements which are useful to the understanding of the described embodiments have been shown and are detailed. In particular, only the transistors have been shown. The memory cells and the interconnection networks to which they may be connected are not detailed.

In the following description, when reference is made to terms qualifying the position and orientation such as "above", "under", "upper", "lower", etc., reference is made to the orientation of the concerned elements in the drawings. The terms "approximately" and "substantially" are used herein to designate a tolerance of plus or minus 10%, preferably of plus or minus 5%, of the value in question.

Unless otherwise specified, when reference is made to two elements connected together, this means that the elements are directly connected with no intermediate element other than conductors, and when reference is made to two elements coupled together, this means that the two elements may be directly coupled (connected) or coupled via one or a plurality of other elements.

Figure 1:
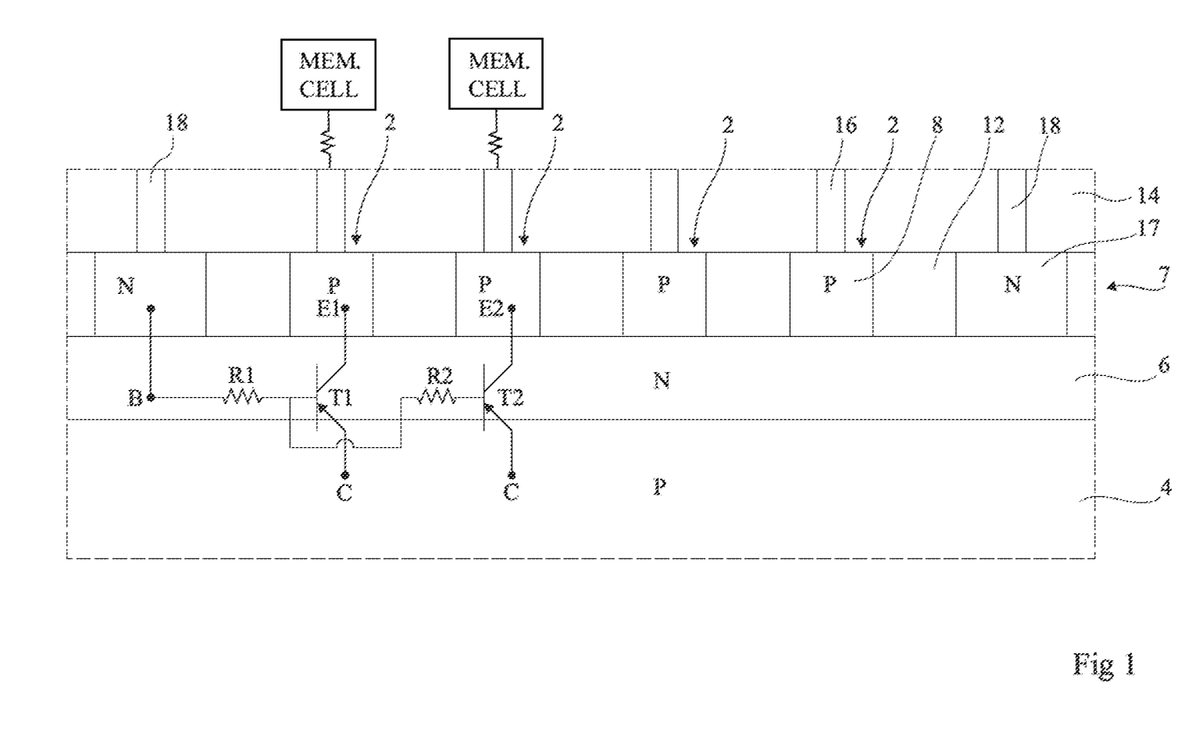
FIG. 1 is a simplified cross-section view of bipolar transistors having a common base.

FIG. 1 is a simplified cross-section view of an integrated circuit portion comprising four bipolar transistors 2, for example of PNP type. The considered bipolar transistors are vertical bipolar transistors, that is, bipolar transistors having their different portions, the base and the regions forming the two conduction terminals, that is, the emitter and the collector, formed one above another. A portion of the equivalent electric diagram has further been shown.

Transistors 2, or T1 and T2 in the equivalent electric diagram, comprise a common collector 4, or C, formed by a layer of P-type semiconductor material. Transistors 2 further comprise a common base 6, or B. Base 6 is formed by a layer of an N-type semiconductor material, for example, silicon, covering collector 4. Base 6 is covered with a layer 7 containing emitters 8, or E1 and E2.

Emitters 8, or E1 and E2, are located on top of and in contact with base 6. Each emitter 8 is formed by a region made of P-type semiconductor material, for example, silicon. Emitters 8 are separated from one another by walls of insulator 12. FIG. 1 shows four emitters 8.

An insulator layer 14 covers emitters 8 and walls 12. Vias 16 cross insulator layer 14 all the way to emitters 8, to couple them to elements, not shown. Vias 16 for example couple emitters 8 to metallization levels of an interconnection network. Vias 16 may also couple emitters 8 to phase-change material via resistive elements, to form memory cells of a phase-change memory controlled by bipolar transistors 2. The four transistors 2 then belong to a same word line of a memory.

Contacting regions 17 of base 6 are evenly distributed. These regions are made of N-type semiconductor material on top of and in contact with base 6 and separated from emitters 8 by insulating walls 12. Regions 17 are more heavily doped than base 6. Regions 17 are coupled by vias 18, similar to vias 16, and by an interconnection network, not shown, to an external connection terminal, not shown.

In the example of FIG. 1, a region 17 is formed every four emitters 8. Indeed, in some embodiments, there may be fewer regions 17 than there are emitters 8. Since the surface area of each region 17 corresponds at least to the surface area of an emitter 8, decreasing the number of regions 17 enables to increase the number of transistors in a row of same length.

However, the semiconductor material of base 6, for example, silicon, has a relatively high resistance. There thus exist parasitic resistors, two of which are shown in the equivalent electric diagram and are designated with references R1 and R2, which may for example be greater than 1 kΩ (kilo ohm) between two transistors or between a transistor and a region 17. The resistance of such a parasitic resistor is all the higher as the emitters and/or regions are distant.

It may be desirable, on the one hand, to have an identical parasitic resistance for all transistors 2, which may be obtained by forming one region 17 for each transistor, and on the other hand, to decrease the surface area for each row of transistors, which may be obtained by forming a single region 17 per row of transistors. A solution is to make a tradeoff by forming regions 17 at regular intervals in each row.

However, the resistance between an emitter 8 and the closest region 17 is not identical for all emitters 8. Further, the presence of regions 17 limits the number of emitters 8, and thus of memory cells, which may be formed on a row of a given length.

Figure 2:
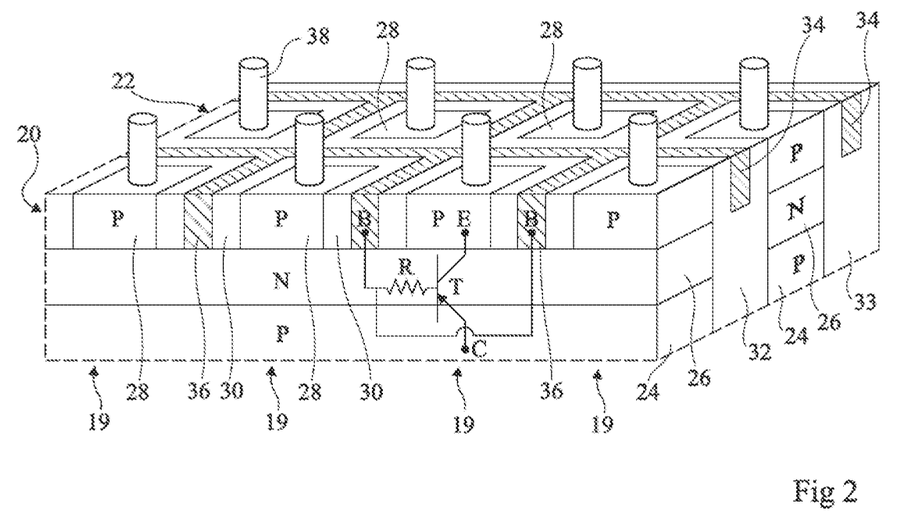
FIG. 2 is a simplified perspective view of an embodiment of bipolar transistors.

FIG. 2 is a simplified perspective view of an embodiment of bipolar transistors 19. A portion of the equivalent electric diagram showing a transistor T and its connections has also been shown.

Figure 3:
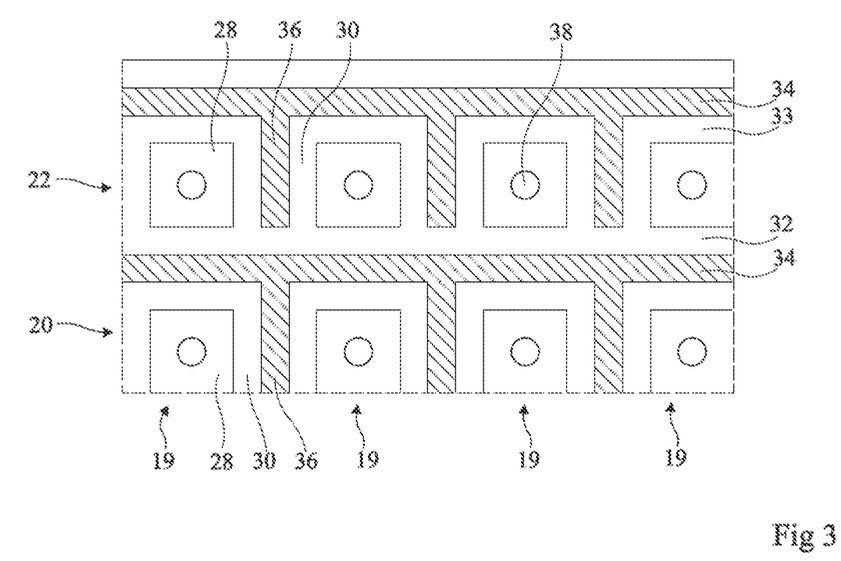
FIG. 3 is a simplified top view of the embodiment of FIG. 2.

FIG. 3 is a top view of the embodiment of FIG. 2.

FIGS. 2 and 3 show an array of eight bipolar transistors, separated in two rows 20 and 22, each comprising four transistors. Each bipolar transistor 19 controls, for example a memory cell of a phase-change memory. Rows 20 and 22 then control word lines of the phase-change memory, and the columns of the array control bit lines of the memory. Each transistor comprises a base (B) and two semiconductor regions forming the conduction terminals, emitter (E) and collector (C).

As illustrated in FIG. 2, each row 20 or 22 of transistors 19 comprises a region 24 forming a collector, common to the entire row in the present example. Region 24 is formed by a layer of semiconductor material, for example, of type P. Each region 24 of a row 20 or 22 is covered with a base 26 common to the transistors of this row, formed by a layer of semiconductor material, for example, of type N.

Regions 28 of semiconductor material, forming emitters and shown in FIGS. 2 and 3, are formed on top of and in contact with base 26, and are separated from one another by insulator walls 30, for example, made of silicon oxide, extending in a first direction. Each transistor 19 further comprises a via 38 crossing an insulator layer, not shown, covering emitters 28. Vias 38 for example enable to connect the transistors to resistive elements, not shown, of a phase-change memory or to an interconnection network.

Rows of bipolar transistors 19 are separated from one another by insulating trenches 32 and 33, for example, made of a usual oxide for insulating trenches or STI ("Shallow Trench Isolation") trenches, for example, made of silicon oxide, extending in a second direction and being sufficiently deep to insulate from one another the transistors 19 of different rows without for all this thoroughly crossing the substrate. The first and second directions are approximately perpendicular. FIGS. 2 and 3 show two insulating trenches 32 and 33, trench 32 separating rows 20 and 22 and trench 33 separating row 22 from a row, not shown. It is here considered that each insulating trench is associated with a row of bipolar transistors parallel to and in contact with the trench. Trench 32 is here associated with row 20 and trench 33 is here associated with row 22.

A main conductive bar 34 extends in each of insulating trenches 32 and 33. Each main conductive bar 34 is sufficiently long to face all the insulator walls 30 separating the emitters of the row of transistors associated with the corresponding trench. Auxiliary conductive bars 36 extend from each main conductive bar 34 in the insulator wall 30 of the associated row. Each emitter 28 of a given row is thus separated from each neighboring emitter by an auxiliary conductive bar 36. Auxiliary conductive bars 36 come into contact, or are more generally coupled, with the common base 26 and are interconnected by main conductive bar 34 to form a comb. Main conductive bars 34 and auxiliary conductive bars 36 are made of a conductive material, preferably, a metal, for example, tungsten.

Each conductive bar 34 may be coupled to an external connection terminal, not shown, by one or a plurality of connections, preferably a single connection for each main conductive bar 34. Each connection is made by neutralizing a transistor location, that is, although a transistor is formed at this location, it is connected to nothing. A via is then formed at each of these locations to couple the conductive bar to an outer connection terminal via the interconnection network.

Each emitter 28 is separated from an auxiliary conductive bar 36, that is, from a contact with the base, by a distance shorter than the width of an insulating wall 30. The parasitic resistance, designated with R in the equivalent electric diagram and formed in the base, is thus identical for all bipolar transistors 19 and is smaller than in the example of FIG. 1. Main conductive bars 34 and auxiliary conductive bars 36 being conductive, they form negligible resistances. In particular, the parasitic resistances formed by main conductive bars 34 and auxiliary conductive bars 36 are smaller than those formed in the base between emitters 8 of FIG. 1, for example, twenty times smaller.

The width of insulator walls 30 depends on the resolution of the masks used during photolithography steps of the bipolar transistor manufacturing method. With current photolithography techniques, the minimum width of trenches capable of being manufactured is approximately 100 nm.

For the voltage values used in memories, for example, a 4-V maximum, it is considered that the minimum silicon oxide thickness for a correct insulation between two conductive elements, that is, for example, emitters 28 and conductive bars 34 and 36, is approximately 10 nm.

It is thus possible to form conductive bars 34 and 36, and thus the width is for example in the range from 25 to 40 nm, inclusive, in insulator walls 30 and in insulating trenches 32, and to keep a 10-nm thickness allowing an insulation considered as correct between emitters 28 and conductive bars 34 and 36.

More generally, the width of conductive bars 34 and 36 is selected according to the width of insulator walls 30 and of insulating trenches 32 and to the voltage that they will have to be capable of insulating.

Figure 4A:
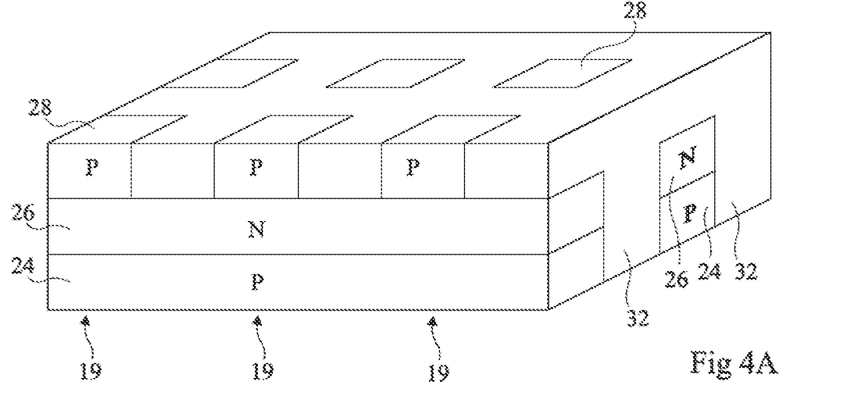
FIGS. 4A to 4C are cross-section views illustrating manufacturing steps of the structure of FIG. 2.
Figure 4B:
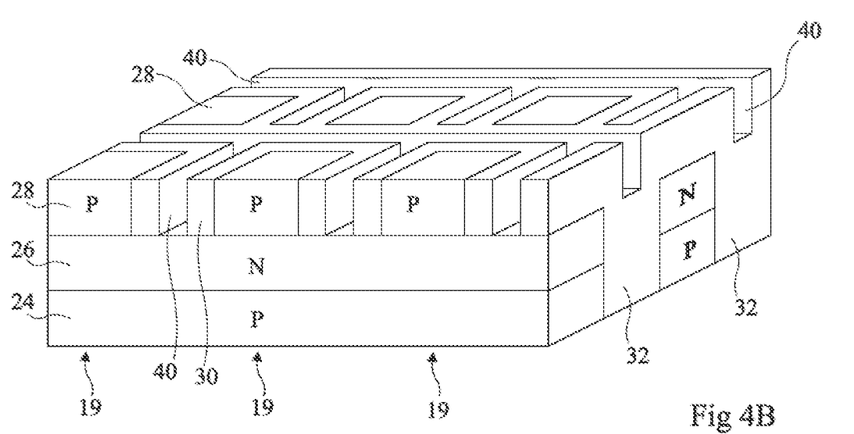
Figure 4C:
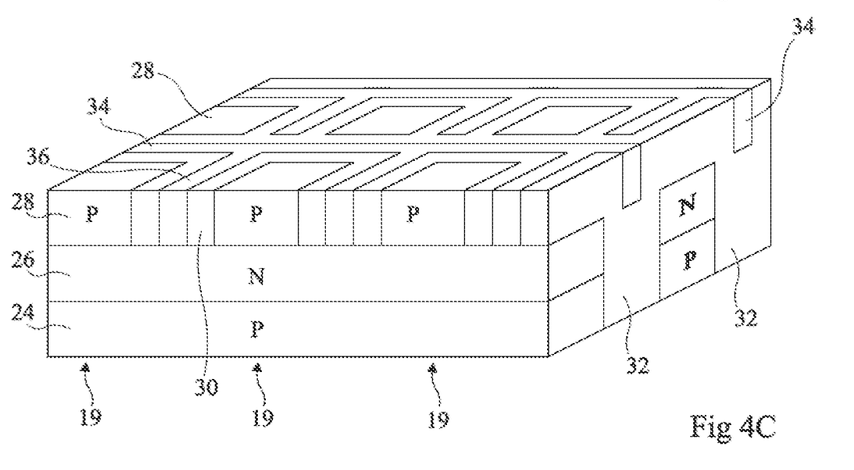

FIGS. 4A to 4C illustrate a method of manufacturing the structure shown in FIG. 2.

FIG. 4A illustrates a step during which transistors 19, that is, the collectors, bases, and emitters, are first formed in a substrate. This step comprises forming and doping the layers forming collectors 24, bases 26, and emitters 28, forming trenches 32 separating the transistor rows, and forming insulator walls 30 separating emitters 28. These steps are for example carried out by usual manufacturing processes. The transistors are for example formed to be as close as possible for existing technologies. The distance between two emitters is for example in the range from 80 to 150 nm, inclusive.

FIG. 4B illustrates a manufacturing step during which a mask, not shown, is deposited on the layer comprising the emitters. The mask comprises openings having the shape of main conductive bars 34 and auxiliary conductive bars 36 respectively located above insulating trenches 32 and insulator walls 30 so that the openings are not, even partially, opposite emitters 28.

An etching is performed to etch cavities 40 through the openings of the mask to reach, between emitters 28, the bases 26 of each row of transistors. The etching is carried out simultaneously for main conductive bars 34 and auxiliary conductive bars 36, which thus approximately have the same depth.

The areas of bases 26 made accessible by the cavities may possibly be re-doped to allow a better electric connection between bases 26 and auxiliary conductive bars 36. These areas are thus more heavily-doped than adjacent areas or regions of the base 26.

FIG. 4C illustrates a manufacturing step during which the cavities are filled with conductive material, preferably a metal, for example, tungsten.

During a subsequent step, not illustrated, an insulator layer is then deposited over the structure and vias are formed. The vias which have been formed comprise the vias 38 connected to emitters 28 of the transistors as well as the vias connected to main conductive bars 34 at the location of the neutralized bit lines and possibly other vias of the same level.

As a variation, for other applications where certain transistors are integrally in parallel, a main conductive bar 34, located in an insulating trench separating transistor rows, may interconnect auxiliary conductive bars 36 located between emitters of two transistor rows.

An advantage of the described embodiments is that the parasitic resistances between the base contacting areas and the different emitters are smaller than in usual implementations and are substantially identical for all transistors.

Another advantage of the described embodiments is that the interconnection of the contacting areas with the base, that is, of auxiliary conductive bars 36, is not performed through the interconnection network. It is thus not necessary to provide the sufficient space for a metallization between the lower level metallizations of the interconnection network coupled to two neighboring emitters. Thus, the distance between two emitters only depends on the resolution of the masks used on manufacturing, on the thickness of insulator enabling to correctly insulate the provided voltages, and on the thickness of the conductive bars.

Another advantage of the described embodiments is an increase in the density of transistors and thus of memory cells. In the case where each word line comprises a single connection to the interconnection network, the length of a row such as that described in relation with FIGS. 2 and 3 is decreased by approximately 35% as compared with a structure of the type in FIG. 1 having the same number of transistors.

Specific embodiments have been described. Various alterations, modifications, and improvements will occur to those skilled in the art. In particular, the bipolar transistors described in relation with the drawings are PNP bipolar transistors. They may however be NPN bipolar transistors.

Further, the transistors described in the present disclosure have been described in the context of transistors controlling memory cells, and more particularly phase-change memory cells. However, the described embodiments may also be implemented for rows of transistors having a common base used in other fields.

In the described embodiments, the conductive bars are for example made of metal. The conductive bars may also be made of polysilicon. The conductive bars may possibly be separated from layer 26 and from insulating walls 30 by a layer of a metal, for example, titanium.

The presence of main and auxiliary conductive bars made of silicon enables to increase the polysilicon density as compared with the polysilicon density in the structure of FIG. 1 or as compared with a structure similar to the structure of FIGS. 2 and 3 where bars 34 and 36 are made of metal. This particularly provides a structure having a thermal stress lower than that of a structure similar to the structure of FIGS. 2 and 3 where bars 34 and 36 would be made of metal.

Such alterations, modifications, and improvements are intended to be part of this disclosure, and are intended to be within the spirit and the scope of the present disclosure.

Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a row of bipolar transistors having a common base, the common base being located between a plurality of first conduction regions and a second conduction region, the first conduction regions separated from one another by insulator walls, an insulating trench in contact with the row of bipolar transistors;
   forming a mask on the plurality of first conduction regions, the mask having a comb-shaped opening over the insulating trench and the insulator walls;
   forming cavities by etching through the opening and exposing portions of the common base between adjacent first conduction regions; and
   filling the cavities with a conductive material.

2. The method of claim 1, wherein the forming the row of bipolar transistors includes:
   forming the second conduction region having a first dopant type;
   forming the common base having a second dopant type opposite the first dopant type;
   forming the plurality of first conduction regions having the first dopant type;
   forming the insulator walls between the first conduction regions; and
   forming the insulating trench in contact with the row of bipolar transistors.

3. The method of claim 2, further comprising:
   forming heavily doped regions in the common base by doping the exposed portions of the common base with the second dopant type, the heavily doped regions of the common base having a higher concentration of the second dopant type than regions of the common base adjacent to the heavily doped regions.

4. The method of claim 1, wherein the conductive material is a metal.

5. The method of claim 1, wherein:
   forming the mask includes depositing the mask on the plurality of first conduction regions, and
   forming the cavities includes etching at least partially into the insulating trench.

6. The method of claim 1, wherein the conductive material includes a metal.

7. The method of claim 1, wherein the conductive material includes polysilicon.

8. A method, comprising:
   forming a row of bipolar transistors, including:
      a plurality of first conduction regions;
      a second conduction region;
      a common base between the first conduction regions and the second conduction region; and
      a plurality of insulator walls extending in a first direction, the first conduction regions being separated from one another by the insulator walls;
   forming an insulating trench extending in a second direction and in contact with each of the bipolar transistors of the row of bipolar transistors, the insulating trench extending entirely across the common base and at least partially into the second conduction region; and
   forming a conductive layer coupled to the base, the conductive layer extending through the insulator walls and extending at least partially into the insulating trench.

9. The method of claim 8, wherein the forming the conductive layer includes forming a main conductive bar extending at least partially into the insulating trench and forming a plurality of auxiliary conductive bars extending through the insulator walls and connected to the main conductive bar.

10. The method of claim 9, wherein the conductive bars have a width in a range from 25 nm to 45 nm, inclusive.

11. The method of claim 8, further comprising forming a via connecting the conductive layer to an interconnection network.

12. The method of claim 8, wherein the conductive layer includes a metal.

13. The method of claim 8, wherein the conductive layer includes polysilicon.

14. The method of claim 8, wherein the plurality of first conduction regions directly contacts the base, and the base directly contacts the second conduction region.

15. The method of claim 8, wherein each of the bipolar transistors of the row of bipolar transistors includes the second conduction region.

16. A method, comprising:
   forming a first row of transistors arranged along a first direction, the forming the first row of transistors including:
      forming a first conduction region having a first dopant type;
      forming a common base on the first conduction region, the common base having a second dopant type opposite the first dopant type;
      forming a plurality of second conduction regions on the common base, the plurality of second conduction regions having the first dopant type, each of the transistors of the first row including a respective second conduction region;
      forming an insulating trench extending in the first direction and in contact with each of the plurality of the transistors of the first row of transistors, the insulating trench extending entirely across the common base and at least partially into the first conduction region; and
      forming a plurality of insulation walls extending along a second direction and positioned between adjacent ones of the second conduction regions, the second direction being transverse to the first direction; and
   forming a plurality of first conductive layers extending along the second direction, each of the plurality of first conductive layers extending through a respective insulation wall and contacting the common base.

17. The method of claim 16, wherein
   the first insulating trench extends entirely across the first conduction region along the first direction.

18. The method of claim 17, further comprising:
   forming a second conductive layer in the first insulating trench, the second conductive layer extending along the first direction and connected to each of the plurality of first conductive layers.

19. The method of claim 18, further comprising:
forming a second row of transistors arranged along the first direction, the second row of transistors being spaced apart from the first row of transistors by the first insulating trench.

20. The method of claim 19, further comprising:
forming a second insulating trench extending along the first direction and in contact with each transistor of the second row of transistors, the second row of transistors being between the first insulating trench and the second insulating trench.

\* \* \* \* \*

UNITED STATES PATENT AND TRADEMARK OFFICE
CERTIFICATE OF CORRECTION

PATENT NO. : 11,882,707 B2
APPLICATION NO. : 17/559821
DATED : January 23, 2024
INVENTOR(S) : Philippe Boivin Page 1 of 1

It is certified that error appears in the above-identified patent and that said Letters Patent is hereby corrected as shown below:

On the Title Page

Item (73) Assignee:
"(73) Assignee: STMicroelectro (Rousset) SAS, Rousset (FR)"
Should read:
--(73) Assignee: STMicroelectronics (Rousset) SAS, Rousset (FR)--

Signed and Sealed this
Eighth Day of October, 2024

Katherine Kelly Vidal
*Director of the United States Patent and Trademark Office*